(12) United States Patent
Zhou et al.

(10) Patent No.: US 12,050,794 B2
(45) Date of Patent: Jul. 30, 2024

(54) READ PERFORMANCE TECHNIQUES FOR TIME RETENTION

(71) Applicant: Micron Technology, Inc., Boise, ID (US)

(72) Inventors: Bo Zhou, Shanghai (CN); Qilin Pan, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 17/726,255

(22) Filed: Apr. 21, 2022

(65) Prior Publication Data

US 2022/0404968 A1 Dec. 22, 2022

Related U.S. Application Data

(60) Provisional application No. 63/212,462, filed on Jun. 18, 2021.

(51) Int. Cl.
*G06F 12/00* (2006.01)
*G06F 1/28* (2006.01)
*G06F 3/06* (2006.01)

(52) U.S. Cl.
CPC ............ *G06F 3/064* (2013.01); *G06F 1/28* (2013.01); *G06F 3/0614* (2013.01); *G06F 3/0673* (2013.01)

(58) Field of Classification Search
CPC .......... G06F 3/064; G06F 1/28; G06F 3/0614; G06F 3/0673; G06F 3/065; G06F 3/0659; G06F 3/0679; G11C 11/5642; G11C 16/349; G11C 29/021; G11C 29/028; G11C 16/26; G11C 16/30
USPC ....................................................... 711/254
See application file for complete search history.

(56) References Cited

U.S. PATENT DOCUMENTS

2013/0055046 A1\* 2/2013 Blodgett ............. G06F 11/0793
714/764
2019/0066787 A1\* 2/2019 Liang ..................... G11C 16/10

FOREIGN PATENT DOCUMENTS

EP 3832655 A1 \* 6/2021 ......... G11C 16/3495

\* cited by examiner

*Primary Examiner* — Mardochee Chery
(74) *Attorney, Agent, or Firm* — Holland & Hart LLP (57) ABSTRACT

Methods, systems, and devices for read performance techniques for time retention are described. A memory system may store data in a block of memory cells and perform a power cycle operation. Based on performing the power cycle operation, the memory system may determine a first voltage offset associated with the block of memory cells by executing a first read command using an auto-read calibration operation. Based on the first voltage offset, and, in some examples, one or more additional voltage offsets, the memory system may calculate a retention time of data stored in the block of memory cells. The memory system may adjust a read voltage based on the retention time and perform one or more additional read commands.

25 Claims, 5 Drawing Sheets

READ PERFORMANCE TECHNIQUES FOR TIME RETENTION

CROSS REFERENCE

The present application for patent claims the benefit of U.S. Provisional Patent Application No. 63/212,462 by Pan et al., entitled "READ PERFORMANCE TECHNIQUES FOR TIME RETENTION," filed Jun. 18, 2021, assigned to the assignee hereof, and expressly incorporated by reference in its entirety herein.

FIELD OF TECHNOLOGY

The following relates generally to one or more systems for memory and more specifically to read performance techniques for time retention.

BACKGROUND

Memory systems, which may include memory devices, are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

In some memory systems, which may include memory devices, slow charge loss (SCL) may impact read performance over time. For example, voltage levels stored in a block of memory cells may gradually change over time due to SCL. As a result, read commands may fail due to the changed data voltages, unnecessarily triggering error handling and increasing read latency. In some cases, a read fail may trigger a series of error handling flow (EHF) events, in which a read voltage is adjusted to attempt to read the data. However, such a process may include multiple EHF events to accurately read the data if SCL has significantly changed the voltage levels of the block of memory cells.

In some cases, a memory system (e.g., a memory device) may determine a voltage offset for read operations after a power cycle to correct for SCL effects. For example, the memory system (e.g., the memory device) may read a sample page of data from a block of memory cells using an auto-read calibration (ARC) operation and calculate the voltage offset based on or in response to reading the sample page. Based on or in response to determining the voltage offset, the device may calculate a retention time of stored data, and subsequently calculate voltage offsets for voltage levels corresponding to stored logic states for the block of memory cells. For example, if the block of memory cells is a tri-level cell (TLC) block, the memory system (e.g., the memory device) may determine a voltage offset for each of eight possible logic states of the memory cells of the block. In subsequent read commands, the memory system (e.g., the memory device) may use the determined voltage offsets to adjust a read voltage used in executing read commands, which may be used to more reliably execute the subsequent read commands at the device.

Figure 1:
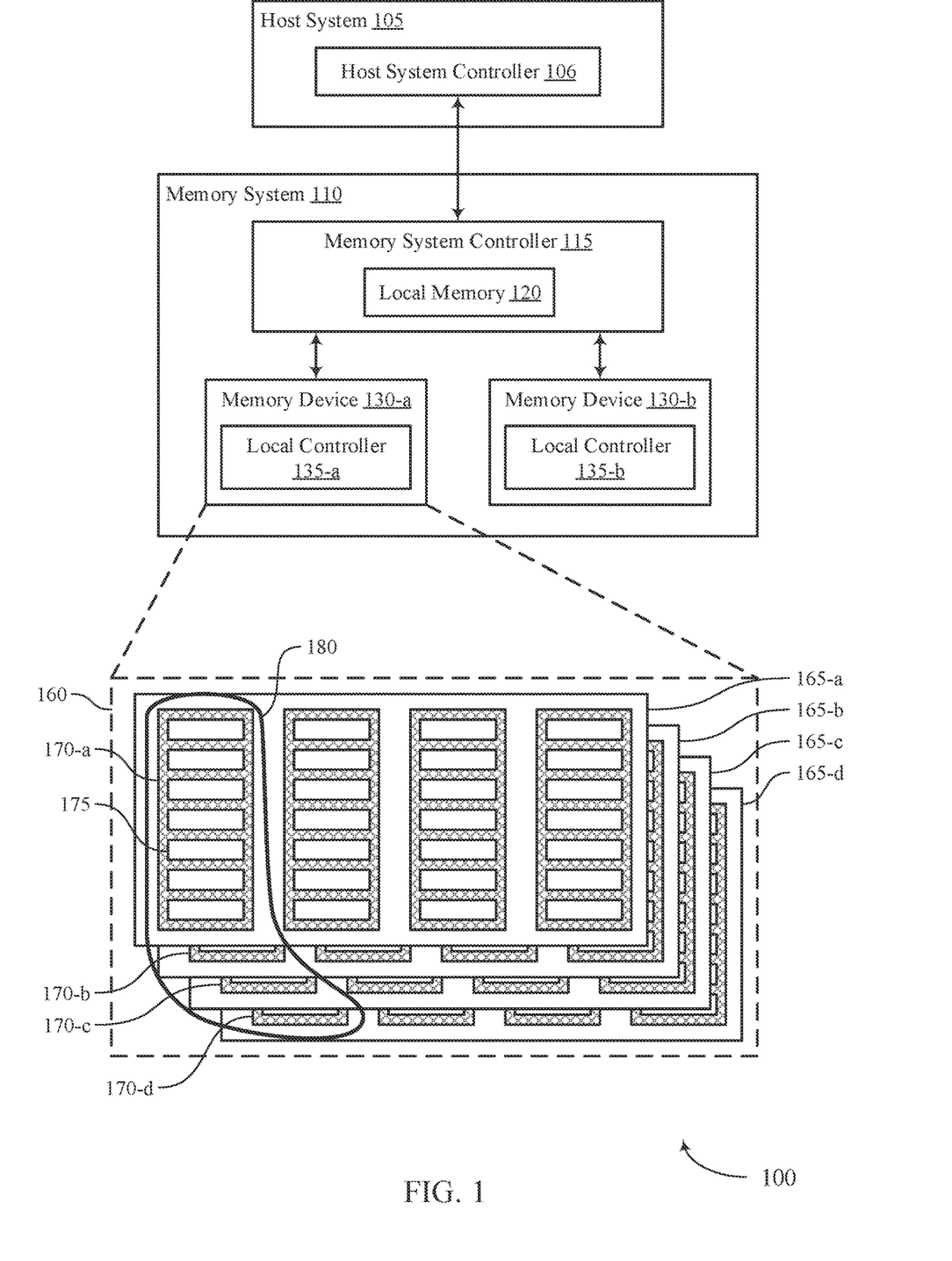
FIG. 1 illustrates an example of a system that supports read performance techniques for time retention in accordance with examples as disclosed herein.

Features of the disclosure are initially described in the context of systems with reference to FIG. 1. Features of the disclosure are described in the context of a voltage diagram and a process flow with reference to FIGS. 2 and 3. These and other features of the disclosure are further illustrated by and described in the context of an apparatus diagram and flowchart that relate to read performance techniques for time retention with reference to FIGS. 4 and 5.

FIG. 1 illustrates an example of a system 100 that supports read performance techniques for time retention in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 110, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EE-PROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as TLCs if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165 c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support read performance techniques for time retention. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a NAND memory device 130, which may include blocks 170 configured to store one or more bits of information (e.g., SLC, MLC, TLC, or QLC blocks 170), may experience SCL. That is, the voltages corresponding to logic states stored in the memory cells of blocks 170 may decrease over time. As a result, read commands executed by the memory device 130 may fail due to the changed data voltages, which may trigger error handling operations and increase read latency. In some cases, a read fail may trigger a series of EHF events, in which a read voltage may be adjusted to attempt to read the data. However, such a process may include multiple EHF events to accurately read the data if SCL has significantly changed the voltage levels of the block of memory cells.

In some cases, the memory device 130 may determine a voltage offset for read operations after a power cycle to correct for SCL effects. For example, the memory device 130 may read a sample page 175 of data from a block 170 (e.g., a block 170-*a*) using an ARC operation and calculate the voltage offset based on or in response to reading the sample page 175. Based on or in response to determining the voltage offset, the memory device 130 may calculate a retention time of stored data, and subsequently calculate voltage offsets for voltage levels corresponding to stored logic states for the block 170. For example, if the block 170-*a* is a TLC block 170, the memory device 130 may determine a voltage offset for each of eight possible logic states of the memory cells of the block 170-*a*. Additionally or alternatively, the memory device 130 may calculate voltage offsets for other blocks 170 (e.g., a block 170-*b*) using the sample page 175 read from the block 170-*a*. In subsequent read commands, the memory device 130 may use the determined voltage offsets to adjust a read voltage used in executing read commands, which may be used to more reliably execute the subsequent read commands at the memory device 130.

Figure 2:
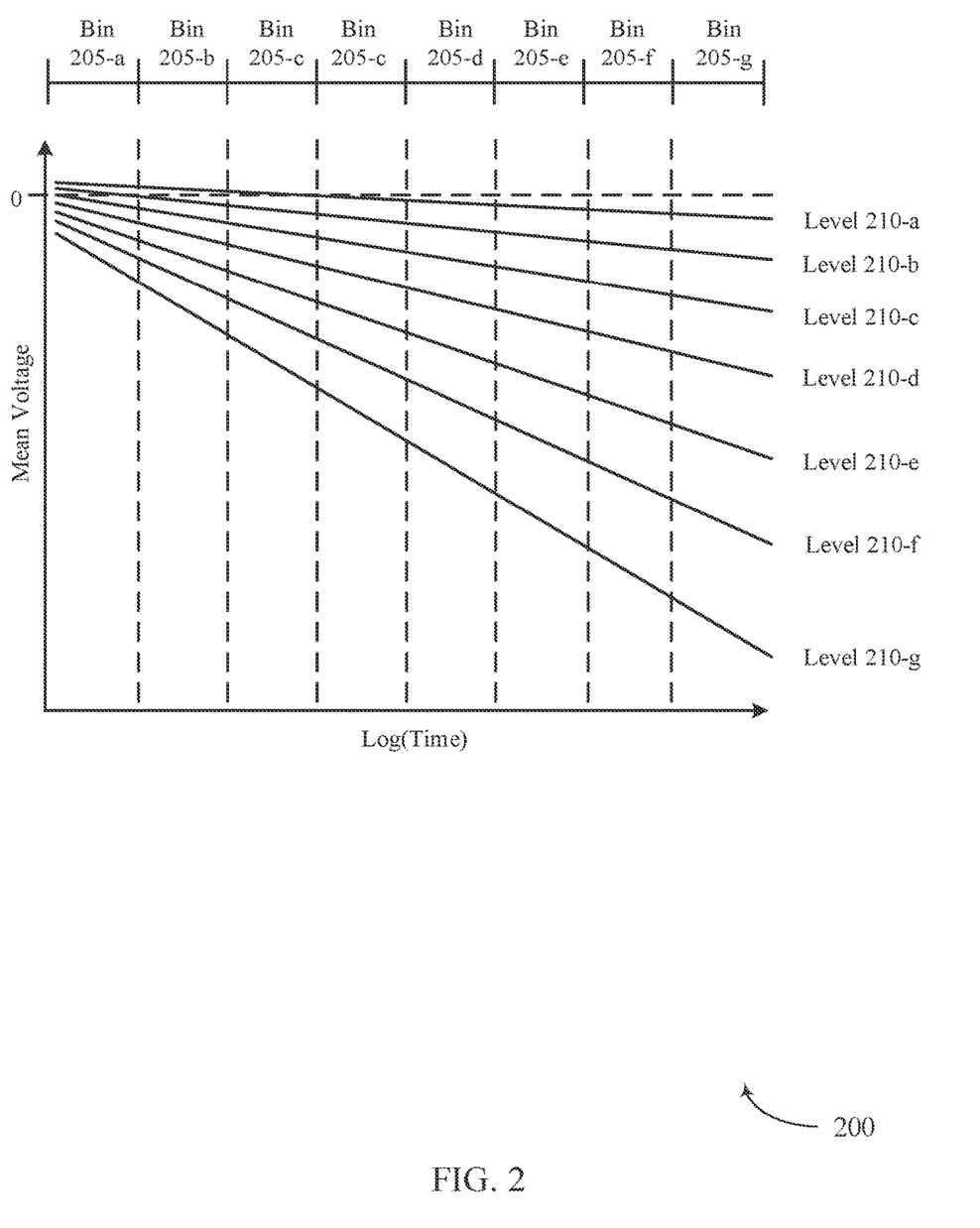
FIG. 2 illustrates an example of a voltage diagram that supports read performance techniques for time retention in accordance with examples as disclosed herein.

FIG. 2 illustrates an example of a voltage diagram 200 that supports read performance techniques for time retention in accordance with examples as disclosed herein. The voltage diagram 200 may illustrate a mean change in voltage over time of a block of memory cells (e.g., as described with reference to FIG. 1). The block of memory cells may be an example a multi-level cell block and may be configured to store multiple bits of data per cell (e.g., three bits of data). For example, the block of memory cells may be an example of a TLC block, and may be configured to store one of eight levels 210 of voltages, each level corresponding to a possible set of three bits (i.e., 000, 001, 010, 100, 011, 101, 110, and 111).

The voltages stored in a block may decrease over time, which may result in a change to the difference of voltages (e.g., the voltage offsets) between the levels 210 of the memory cells. That is, the block may experience SCL that may result in a change of voltage offsets. The effect of SCL on the voltage levels of the block may be log-linear over time. That is, the voltage levels may decrease linearly if plotted against a logarithmic time scale, as illustrated in FIG. 2. In some cases, the length of time the block experiences SCL may be classified as one of a set of bins 205. For example, a block in a bin 205-*b* may have experience SCL for a longer time relative to a block in a bin 205-*a*.

In some cases, the effects of SCL may be accelerated by subjecting the block to a high temperature bake. For example, repeatedly baking a block at 125 degrees Celsius for four hours may simulate the SCL of a block not subjected to a high temperature bake over a relatively longer time period. In such a simulation, the read performance of the memory device may drop as a result of the SCL as much as, by way of example, 50 percent for every four hours baked. The drop in the read performance may be due to the bin 205 not being updated in time, thus resulting in a series of failed reads. In some cases, a read fail may trigger an EHF, in which the memory device may attempt to adjust the read voltage to accurately read data stored in the block. Triggering multiple EHFs may lead to long read latency.

The change in levels 210 of blocks may be determined (e.g., calculated) after a power cycle (e.g., after the blocks have undergone the effects of SCL) by performing a read operation on a sample page of data (e.g., performing an ARC on a sample page) after a power cycle event. In some examples, the sample page may be read from an open TLC block or a young TLC block (e.g., a closed TLC block in bin 205-*a* or bin 205-*b*).

In some cases, the change in levels 210 may be calculated by determining the voltage offset of one of the levels 210. For example, the voltage offset of level 210-*g* may be determined by performing an ARC operation on the sample page of data. Based on or in response to the voltage offset of level 210-*g*, the voltage offsets of the remaining levels (e.g., levels 210-*a* through 210-*f*) may be calculated.

Determining the voltage offset of the levels 210 may include calculating a retention time. The retention time may indicate a length of time that the block was in a retention state (e.g., a power off state) prior to the power cycle. In some cases, all blocks of the memory device may experience the same retention time, and thus experience the same SCL. In some examples, the retention time may be used to determine in which of the set of bins 205 the block may be.

In some cases, the remaining voltage offsets (e.g., the voltage offsets of levels 210-*a* through 210-*f*) may be determined based on or in response to determining the retention time. For example, each of the set of bins 205 may correspond to a given set of voltage offsets for each level 210, and thus a block may use the retention time to determine the bin of the block. In such examples, the voltage offsets of each of the levels 210 may be determined by mapping the bin 205 of the block to the corresponding voltage offsets. In some cases, the mapping may be stored in the memory device. Mapping the bin 205 of the block to the voltage offsets may mitigate (e.g., reduce) storage resource usage and computation resources, because a finite number of bins 205 (e.g., eight bins 205) may be stored. Additionally or alternatively, the remaining voltage offsets may be calculated based on or in response to determining the retention time. In some cases, there may be a fixed ratio between the voltage offsets of the levels 210 in each bin 205. By determining the voltage offset of one of the levels 210 (e.g., level 210-*g*), as well as determining the bin 205 of the block, the remaining voltage offsets of the levels 210 (e.g., level 210-*a* through level 210-*f*) may be calculated using the fixed ratio.

Figure 3:
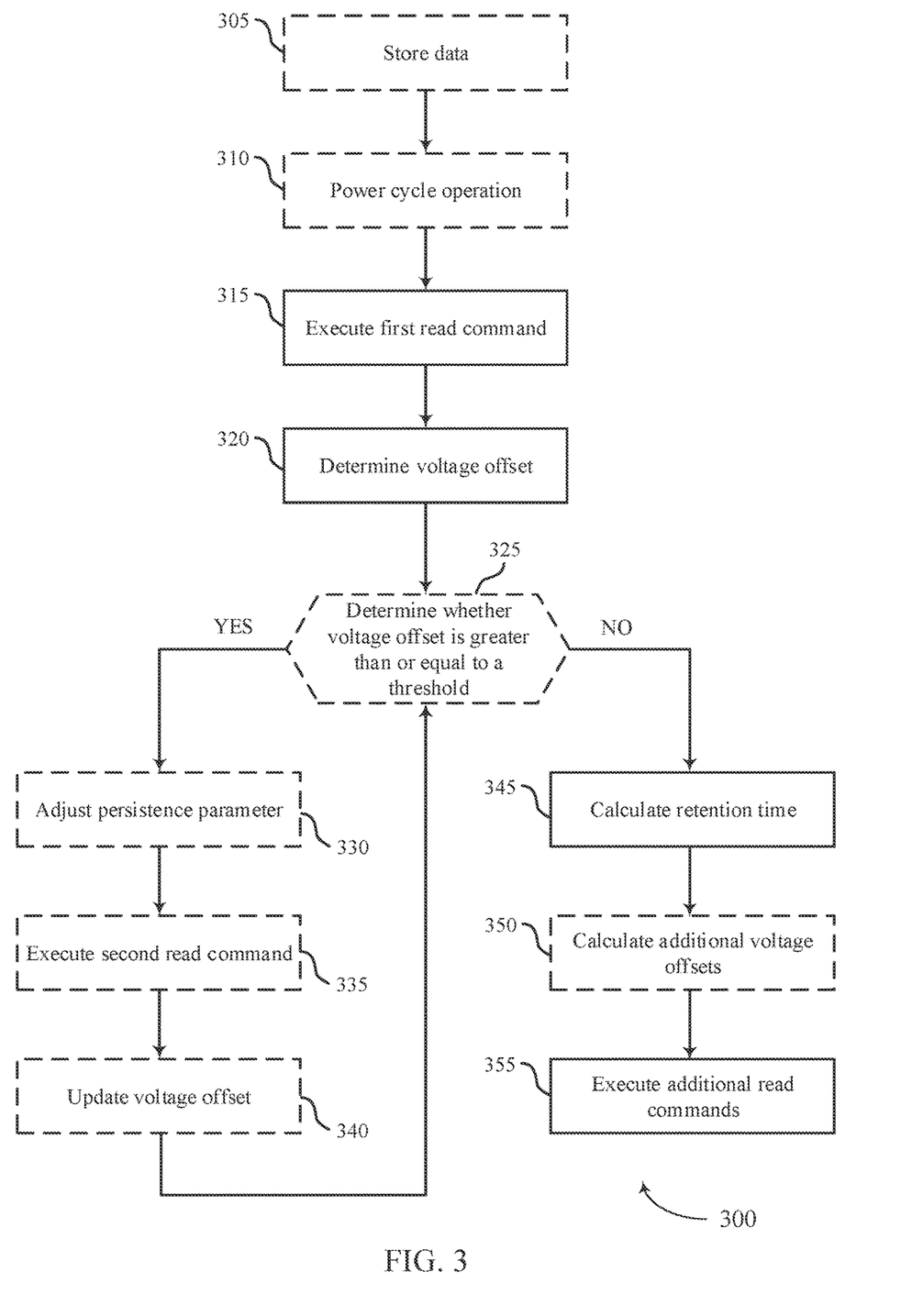
FIG. 3 illustrates an example of a process flow that supports read performance techniques for time retention in accordance with examples as disclosed herein.

FIG. 3 illustrates an example of a process flow 300 that supports read performance techniques for time retention in accordance with examples as disclosed herein. The process flow 300 may be performed by components of a memory system, such as a memory system 110 described with reference to FIG. 1. For example, the process flow 300 may be performed by a controller of a memory system or a memory device (or both) such as a memory system controller 115 or a local controller 135, respectively, as described with reference to FIG. 1. The process flow 300 may be implemented to reduce latency and power consumption and increase system performance, among other benefits. Aspects of the process flow 300 may be implemented by a controller, among other components. Additionally or alternatively, aspects of the process flow 300 may be implemented as instructions stored in memory (e.g., firmware stored in a memory coupled with the memory system controller 115 or the local controller 135). For example, the instructions, if executed by a controller (e.g., a memory system controller 115, a local controller 135), may cause the controller to perform the operations of the process flow 300. In the following description of process flow 300, the operations may be performed in a different order than the order shown. For example, specific operations may also be left out of process flow 300, or other operations may be added to process flow 300.

At 305, data may be stored in a block of memory cells (e.g., by the controller). In some cases, the data may include a sample page (e.g., a page 175 described with reference to FIG. 1). The sample page may include memory cells programmed to a predetermined state. Subsequently, at 310, the controller may perform a power cycling operation. For example, the controller may perform the power cycling operation after storing data in the block of memory cells.

At 315, a first read command may be executed (e.g., by the controller). For example, the controller may execute the first read command to retrieve a page of the block of memory cells. In some cases, the controller may execute the first read command based on or in response to performing the power cycle operation at 310. The page may be an example of a sample page (e.g., as described in reference to FIGS. 1 and 2) and executing the read command may include reading the sample page using ARC or using another method to determine the voltage offset (e.g., the read command may be an ARC read).

At 320, a first voltage offset may be determined (e.g., by the controller). For example, the controller may determine the first voltage offset (e.g., the voltage offset of one of the levels 210 described with reference to FIG. 2) associated with the block of memory cells. In some cases, the controller may determine the first voltage offset based on or in response to performing an ARC operation on a sample page of the block of memory cells.

At 325, it may be determined whether the first voltage offset is greater than or equal to a voltage threshold (e.g., by the controller). For example, the controller may determine whether the change in voltage associated with the first voltage offset is greater than or equal to the voltage threshold. In some examples, the voltage threshold may be about 90 millivolts. In some cases, the first voltage offset satisfying the threshold may indicate that the ARC operation did not find a valley bottom. That is, the ARC operation may not be able to detect a voltage offset greater than the voltage threshold. If the first voltage offset is greater than the voltage threshold, then the ARC operation may not find an accurate first voltage offset. In other cases (e.g., when methods other than ARC are used to determine the first voltage offset), the voltage threshold may be different, or the first voltage offset may be determined using a single read method.

If, at 325, it is determined that the first voltage offset is greater than or equal to the voltage threshold, 330, 335, and 340 may be performed (e.g., by the controller). At 330, a persistence parameter associated with executing read commands may be adjusted (e.g., by the controller), for example based on or in response to determining that the first voltage offset is greater than or equal to the voltage threshold. For example, the controller may, as part of adjusting the persistence parameter, enter a persist-on mode, in which the read voltage of the ARC operation is adjusted (e.g., to more accurately measure the first voltage offset determined at 320).

At 335, a second read command (e.g., a second ARC operation) may be executed (e.g., by the controller). For example, the controller may execute the second ARC operation to retrieve the page associated with the block of memory cells (e.g., the sample page read at 315) based on or in response to adjusting the persistence parameter at 330. That is, the second ARC operation may read the sample page with persist-on. Subsequently, at 340, an updated first voltage offset may be determined. For example, the controller may, based on or in response to reading the sample page, update the first voltage offset based on or in response to the result of the second ARC operation performed with persist-on. After updating the first voltage offset, the controller may again, at 325, determine whether the first voltage offset is greater than or equal to a voltage threshold. If, at 325, the controller determines that the first voltage offset is less than the voltage threshold, the controller may perform one or more of 345, 350, and 355.

At 345, a retention time may be calculated (e.g., by the controller). The retention time may be associated with a duration after the data is stored in the block of memory cells at 305 and before the power cycling operation 310 is performed. For example, the retention time may indicate how long the data has been stored prior to performing the power cycling operation. In some cases, calculating the retention time may be based on or in response to determining the first voltage offset at 320. Additionally or alternatively (e.g., if the first voltage offset is greater than or equal to the voltage threshold), the retention time may be based on or in response to determining the updated first voltage offset at 340. For example, the controller may use a configured relationship between first voltage offset and the retention time to calculate the retention time.

At 350, one or more additional voltage offsets may be calculated (e.g., by the controller). In some cases, the controller may calculate a second voltage offset associated with a second block of memory cells based on or in response to calculating the retention time at 345. For example, the controller may use a relationship between the retention time and voltage offsets (e.g., the voltage diagram 200 described with reference to FIG. 2), to calculate the second voltage offset.

In some cases, the controller may calculate one or more additional voltage offsets based on or in response to calculating the retention time at 345, as well as a ratio associated with the first voltage offset. For example, there may be a proportional relationship between the first voltage offset and the one or more additional voltage offsets. Therefore, determining the first voltage offset may allow the one or more additional voltage offsets to be calculated based on the ratio. Additionally or alternatively, the controller may calculate the one or more additional voltage offsets based on or in response to calculating the retention time at 345, as well as a formula associated with the first voltage offset.

At 355, one or more additional read commands may be executed. For example, the controller may execute a third read command. The third read command may include instructions to retrieve data from the second block of memory cells based on or in response to calculating (e.g., using) the second voltage offset. In some examples, the memory device may execute the one or more additional read commands based on or in response to determining the first voltage offset at 320 and calculating the retention time at

345. In some examples, the one or more additional read commands may also be executed based on or in response to calculating (e.g., using) the one or more voltage offsets calculated at 350. In some cases, the controller may determine a bin of the block of memory cells based on the first voltage offset and the one or more additional voltage offsets, for example, using the voltage diagram 200 described with reference to FIG. 2. That is, the memory device may operate according to the one or more voltage offsets and determined bin. For example, the memory device may read from the block of memory cells or other blocks of memory cells using the one or more voltage offsets and determined bin.

Figure 4:
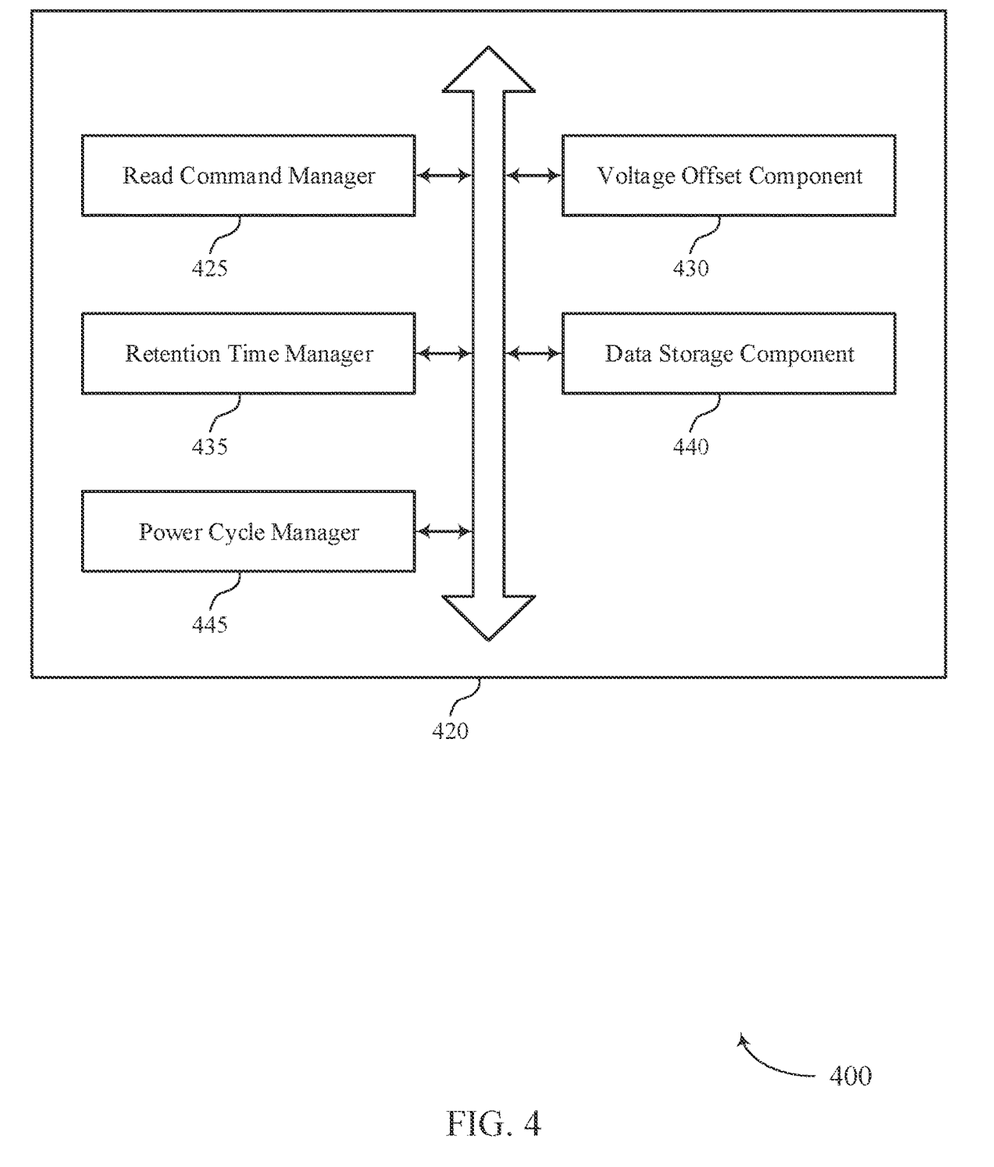
FIG. 4 shows a block diagram of a memory system that supports read performance techniques for time retention in accordance with examples as disclosed herein.

FIG. 4 shows a block diagram 400 of a memory system 420 that supports read performance techniques for time retention in accordance with examples as disclosed herein. The memory system 420 may be an example of aspects of a memory system as described with reference to FIGS. 1 through 3. The memory system 420, or various components thereof, may be an example of means for performing various aspects of read performance techniques for time retention as described herein. For example, the memory system 420 may include a read command manager 425, a voltage offset component 430, a retention time manager 435, a data storage component 440, a power cycle manager 445, or any combination thereof. Each of these components may communicate, directly or indirectly, with one another (e.g., via one or more buses).

The read command manager 425 may be configured as or otherwise support a means for executing, by a memory system, a first read command to retrieve a page of a block of memory cells. The voltage offset component 430 may be configured as or otherwise support a means for determining a first voltage offset associated with the block of memory cells based at least in part on executing the first read command. The retention time manager 435 may be configured as or otherwise support a means for calculating a retention time of stored information associated with the first read command based at least in part on determining the first voltage offset. In some examples, the read command manager 425 may be configured as or otherwise support a means for executing one or more additional read commands based at least in part on determining the first voltage offset and calculating the retention time.

In some examples, the data storage component 440 may be configured as or otherwise support a means for storing data in the block of memory cells. In some examples, the power cycle manager 445 may be configured as or otherwise support a means for performing, by the memory system, a power cycling operation after storing the data in the block of memory cells, where the first read command is executed based at least in part on performing the power cycling operation.

In some examples, the retention time is associated with a duration after the data is stored in the block of memory cells and before the power cycling operation is performed by the memory system.

In some examples, the voltage offset component 430 may be configured as or otherwise support a means for calculating a second voltage offset based at least in part on calculating the retention time, the second voltage offset associated with a second block of memory cells. In some examples, the read command manager 425 may be configured as or otherwise support a means for executing a second read command to retrieve data from the second block of memory cells based at least in part on calculating the second voltage offset.

In some examples, the voltage offset component 430 may be configured as or otherwise support a means for calculating, based at least in part on calculating the retention time and a ratio associated with the first voltage offset, one or more additional voltage offsets associated with the block of memory cells, where the one or more additional read commands are executed based at least in part on calculating the one or more additional voltage offsets.

In some examples, the voltage offset component 430 may be configured as or otherwise support a means for calculating, based at least in part on calculating the retention time and a formula associated with the first voltage offset, one or more additional voltage offsets associated with the block of memory cells, where the one or more additional read commands are executed based at least in part on calculating the one or more additional voltage offsets.

In some examples, the voltage offset component 430 may be configured as or otherwise support a means for determining whether the first voltage offset associated with the block of memory cells is greater than or equal to a voltage threshold. In some examples, the read command manager 425 may be configured as or otherwise support a means for adjusting a persistence parameter associated with execution of read commands based at least in part on determining that the first voltage offset is greater than or equal the voltage threshold. In some examples, the read command manager 425 may be configured as or otherwise support a means for executing a second read command to retrieve the page of the block of memory cells based at least in part on adjusting the persistence parameter. In some examples, the voltage offset component 430 may be configured as or otherwise support a means for determining an updated first voltage offset associated with the block of memory cells based at least in part on executing the second read command, where the retention time is calculated and the one or more additional read commands are executed based at least in part on determining the updated first voltage offset.

In some examples, the updated first voltage offset is less than the voltage threshold. In some examples, the voltage threshold is about 90 millivolts.

Figure 5:
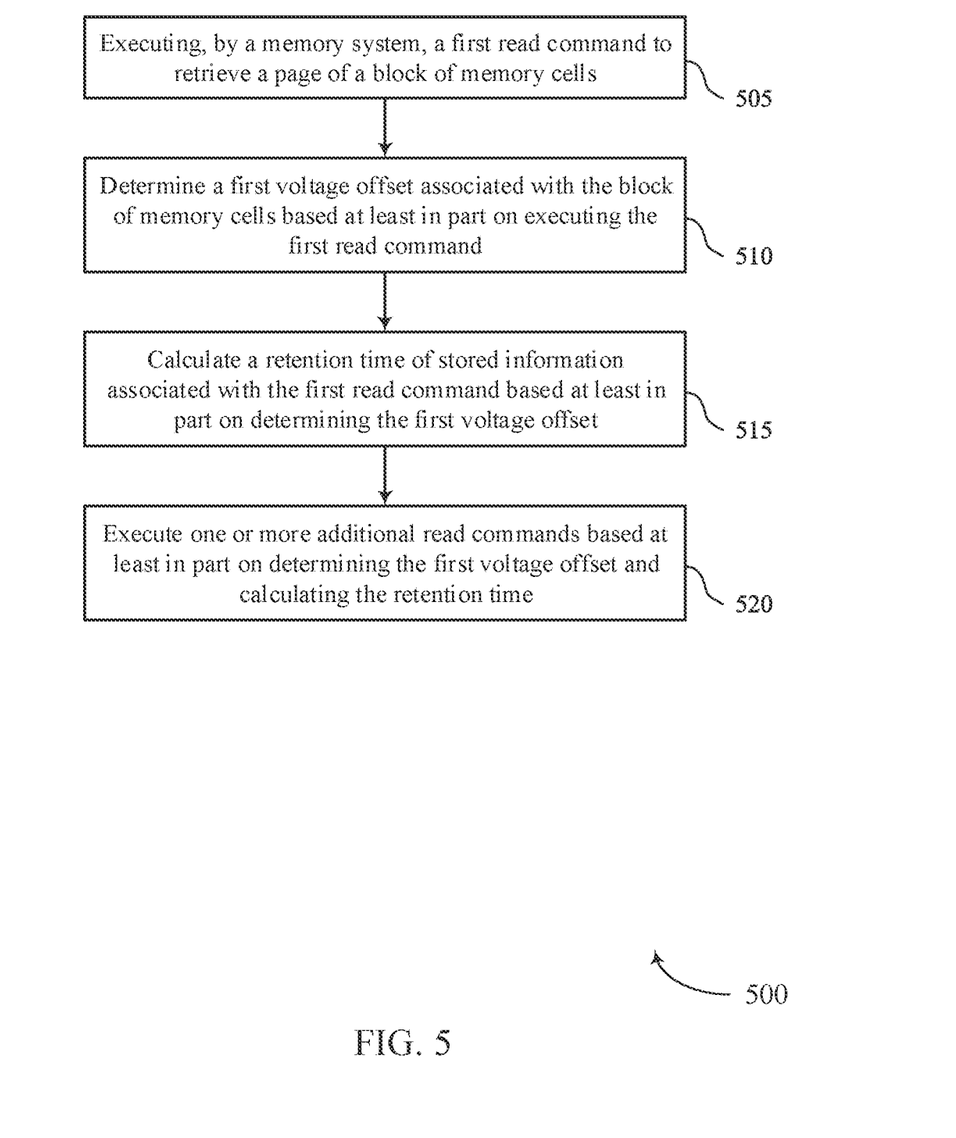
FIG. 5 shows a flowchart illustrating a method or methods that support read performance techniques for time retention in accordance with examples as disclosed herein.

FIG. 5 shows a flowchart illustrating a method 500 that supports read performance techniques for time retention in accordance with examples as disclosed herein. The operations of method 500 may be implemented by a memory system or its components as described herein. For example, the operations of method 500 may be performed by a memory system as described with reference to FIGS. 1 through 4. In some examples, a memory system may execute a set of instructions to control the functional elements of the device to perform the described functions. Additionally or alternatively, the memory system may perform aspects of the described functions using special-purpose hardware.

At 505, the method may include executing, by a memory system, a first read command to retrieve a page of a block of memory cells. The operations of 505 may be performed in accordance with examples as disclosed herein. In some examples, aspects of the operations of 505 may be performed by a read command manager 425 as described with reference to FIG. 4.

At 510, the method may include determining a first voltage offset associated with the block of memory cells based at least in part on executing the first read command. The operations of 510 may be performed in accordance with examples as disclosed herein. In some examples, aspects of the operations of 510 may be performed by a voltage offset component 430 as described with reference to FIG. 4.

At 515, the method may include calculating a retention time of stored information associated with the first read command based at least in part on determining the first voltage offset. The operations of 515 may be performed in accordance with examples as disclosed herein. In some examples, aspects of the operations of 515 may be performed by a retention time manager 435 as described with reference to FIG. 4.

At 520, the method may include executing one or more additional read commands based at least in part on determining the first voltage offset and calculating the retention time. The operations of 520 may be performed in accordance with examples as disclosed herein. In some examples, aspects of the operations of 520 may be performed by a read command manager 425 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for executing, by a memory system, a first read command to retrieve a page of a block of memory cells, determining a first voltage offset associated with the block of memory cells based at least in part on executing the first read command, calculating a retention time of stored information associated with the first read command based at least in part on determining the first voltage offset, and executing one or more additional read commands based at least in part on determining the first voltage offset and calculating the retention time.

Some examples of the method 500 and the apparatus described herein may further include operations, features, circuitry, logic, means, or instructions for storing data in the block of memory cells and performing, by the memory system, a power cycling operation after storing the data in the block of memory cells, where the first read command may be executed based at least in part on performing the power cycling operation.

In some examples of the method 500 and the apparatus described herein, the retention time may be associated with a duration after the data may be stored in the block of memory cells and before the power cycling operation may be performed by the memory system.

Some examples of the method 500 and the apparatus described herein may further include operations, features, circuitry, logic, means, or instructions for calculating a second voltage offset based at least in part on calculating the retention time, the second voltage offset associated with a second block of memory cells and executing a second read command to retrieve data from the second block of memory cells based at least in part on calculating the second voltage offset.

Some examples of the method 500 and the apparatus described herein may further include operations, features, circuitry, logic, means, or instructions for calculating, based at least in part on calculating the retention time and a ratio associated with the first voltage offset, one or more additional voltage offsets associated with the block of memory cells, where the one or more additional read commands may be executed based at least in part on calculating the one or more additional voltage offsets.

Some examples of the method 500 and the apparatus described herein may further include operations, features, circuitry, logic, means, or instructions for calculating, based at least in part on calculating the retention time and a formula associated with the first voltage offset, one or more additional voltage offsets associated with the block of memory cells, where the one or more additional read commands may be executed based at least in part on calculating the one or more additional voltage offsets.

Some examples of the method 500 and the apparatus described herein may further include operations, features, circuitry, logic, means, or instructions for determining whether the first voltage offset associated with the block of memory cells may be greater than or equal to a voltage threshold, adjusting a persistence parameter associated with execution of read commands based at least in part on determining that the first voltage offset may be greater than or equal the voltage threshold, executing a second read command to retrieve the page of the block of memory cells based at least in part on adjusting the persistence parameter, and determining an updated first voltage offset associated with the block of memory cells based at least in part on executing the second read command, where the retention time may be calculated and the one or more additional read commands may be executed based at least in part on determining the updated first voltage offset.

In some examples of the method 500 and the apparatus described herein, the updated first voltage offset may be less than the voltage threshold.

In some examples of the method 500 and the apparatus described herein, the voltage threshold may be about 90 millivolts.

It should be noted that the methods described above describe possible implementations, and that the operations and the steps may be rearranged or otherwise modified and that other implementations are possible. Further, portions from two or more of the methods may be combined.

An apparatus is described. The apparatus may include a memory device and a controller coupled with the memory device and configured to cause the apparatus to execute, by the memory device, a first read command to retrieve a page of a block of memory cells, determine a first voltage offset associated with the block of memory cells based at least in part on executing the first read command, calculate a retention time of stored information associated with the first read command based at least in part on determining the first voltage offset, and execute one or more additional read commands based at least in part on determining the first voltage offset and calculating the retention time.

In some examples, the apparatus may include store data in the block of memory cells and perform, by the memory device, a power cycling operation after storing the data in the block of memory cells, where the first read command may be executed based at least in part on performing the power cycling operation.

In some examples of the apparatus, the retention time may be associated with a duration after the data may be stored in the block of memory cells and before the power cycling operation may be performed by the memory device.

In some examples, the apparatus may include calculate a second voltage offset based at least in part on calculating the retention time, the second voltage offset associated with a second block of memory cells and execute a second read command to retrieve data from the second block of memory cells based at least in part on calculating the second voltage offset.

In some examples of the apparatus, the controller may be further configured to cause the apparatus to calculate, based at least in part on calculating the retention time and a ratio associated with the first voltage offset, one or more additional voltage offsets associated with the block of memory cells, where the one or more additional read commands may be executed based at least in part on calculating the one or more additional voltage offsets.

In some examples of the apparatus, the controller may be further configured to cause the apparatus to calculate, based at least in part on calculating the retention time and a formula associated with the first voltage offset, one or more additional voltage offsets associated with the block of memory cells, where the one or more additional read commands may be executed based at least in part on calculating the one or more additional voltage offsets.

In some examples, the apparatus may include determine whether the first voltage offset associated with the block of memory cells may be greater than or equal to a voltage threshold, adjust a persistence parameter associated with execution of read commands based at least in part on determining that the first voltage offset may be greater than or equal to the voltage threshold, execute a second read command to retrieve the page of the block of memory cells based at least in part on adjusting the persistence parameter, and determine an updated first voltage offset associated with the block of memory cells based at least in part on executing the second read command, where the retention time may be calculated and the one or more additional read commands may be executed based at least in part on determining the updated first voltage offset.

In some examples of the apparatus, the updated first voltage offset may be less than the voltage threshold.

In some examples of the apparatus, the voltage threshold may be about 90 millivolts.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed, and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate.

The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory device, comprising:
   one or more memory arrays; and
   processing circuitry coupled with the one or more memory arrays and configured to cause the memory device to:
   execute, by the memory device, a first read command to retrieve a page of a block of memory cells;
   determine a first voltage offset associated with the block of memory cells based at least in part on executing the first read command;
   calculate a retention time of stored information associated with the first read command based at least in part on determining the first voltage offset, wherein the retention time indicates a duration associated with a power off state of the block of memory cells; and execute one or more additional read commands based at least in part on determining the first voltage offset and calculating the retention time.

2. The memory device of claim 1, wherein the processing circuitry is further configured to cause the memory device to:

store data in the block of memory cells; and perform, by the memory device, a power cycling operation after storing the data in the block of memory cells, wherein the first read command is executed based at least in part on performing the power cycling operation.

3. The memory device of claim 2, wherein the retention time is associated with a duration after the data is stored in the block of memory cells and before the power cycling operation is performed by the memory device.

4. The memory device of claim 1, wherein the processing circuitry is further configured to cause the memory device to:

calculate a second voltage offset based at least in part on calculating the retention time, the second voltage offset associated with a second block of memory cells; and execute a second read command to retrieve data from the second block of memory cells based at least in part on calculating the second voltage offset.

5. The memory device of claim 1, wherein the processing circuitry is further configured to cause the memory device to:

calculate, based at least in part on calculating the retention time and a ratio associated with the first voltage offset, one or more additional voltage offsets associated with the block of memory cells, wherein the one or more additional read commands are executed based at least in part on calculating the one or more additional voltage offsets.

6. The memory device of claim 1, wherein the processing circuitry is further configured to cause the memory device to:

calculate, based at least in part on calculating the retention time and a formula associated with the first voltage offset, one or more additional voltage offsets associated with the block of memory cells, wherein the one or more additional read commands are executed based at least in part on calculating the one or more additional voltage offsets.

7. The memory device of claim 1, wherein the processing circuitry is further configured to cause the memory device to:

determine whether the first voltage offset associated with the block of memory cells is greater than or equal to a voltage threshold;

adjust a persistence parameter associated with execution of read commands based at least in part on determining that the first voltage offset is greater than or equal to the voltage threshold;

execute a second read command to retrieve the page of the block of memory cells based at least in part on adjusting the persistence parameter; and determine an updated first voltage offset associated with the block of memory cells based at least in part on executing the second read command, wherein the retention time is calculated and the one or more additional read commands are executed based at least in part on determining the updated first voltage offset.

8. The memory device of claim 7, wherein the updated first voltage offset is less than the voltage threshold.

9. The memory device of claim 7, wherein the voltage threshold is about 90 millivolts.

10. A non-transitory computer-readable medium storing code comprising instructions which, when executed by a processor of an electronic device, cause the electronic device to:

execute, by the electronic device, a first read command to retrieve a page of a block of memory cells;

determine a first voltage offset associated with the block of memory cells based at least in part on executing the first read command;

calculate a retention time of stored information associated with the first read command based at least in part on determining the first voltage offset, wherein the retention time indicates a duration associated with a power off state of the block of memory cells; and execute one or more additional read commands based at least in part on determining the first voltage offset and calculating the retention time.

11. The non-transitory computer-readable medium of claim 10, wherein the instructions, when executed by the processor of the electronic device, further cause the electronic device to:

store data in the block of memory cells; and perform, by the electronic device, a power cycling operation after storing the data in the block of memory cells, wherein the first read command is executed based at least in part on performing the power cycling operation.

12. The non-transitory computer-readable medium of claim 11, wherein the retention time is associated with a duration after the data is stored in the block of memory cells and before the power cycling operation is performed by the electronic device.

13. The non-transitory computer-readable medium of claim 10, wherein the instructions, when executed by the processor of the electronic device, further cause the electronic device to:

calculate a second voltage offset based at least in part on calculating the retention time, the second voltage offset associated with a second block of memory cells; and execute a second read command to retrieve data from the second block of memory cells based at least in part on calculating the second voltage offset.

14. The non-transitory computer-readable medium of claim 10, wherein the instructions, when executed by the processor of the electronic device, further cause the electronic device to:

calculate, based at least in part on calculating the retention time and a ratio associated with the first voltage offset, one or more additional voltage offsets associated with the block of memory cells, wherein the one or more additional read commands are executed based at least in part on calculating the one or more additional voltage offsets.

15. The non-transitory computer-readable medium of claim 10, wherein the instructions, when executed by the processor of the electronic device, further cause the electronic device to:

calculate, based at least in part on calculating the retention time and a formula associated with the first voltage offset, one or more additional voltage offsets associated with the block of memory cells, wherein the one or more additional read commands are executed based at least in part on calculating the one or more additional voltage offsets.

16. The non-transitory computer-readable medium of claim 10, wherein the instructions, when executed by the processor of the electronic device, further cause the electronic device to:
- determine whether the first voltage offset associated with the block of memory cells is greater than or equal to a voltage threshold;
- adjust a persistence parameter associated with execution of read commands based at least in part on determining that the first voltage offset is greater than or equal the voltage threshold;
- execute a second read command to retrieve the page of the block of memory cells based at least in part on adjusting the persistence parameter; and
- determine an updated first voltage offset associated with the block of memory cells based at least in part on executing the second read command, wherein the retention time is calculated and the one or more additional read commands are executed based at least in part on determining the updated first voltage offset.

17. The non-transitory computer-readable medium of claim 16, wherein the updated first voltage offset is less than the voltage threshold.

18. A method, comprising:
- executing, by a memory system, a first read command to retrieve a page of a block of memory cells;
- determining a first voltage offset associated with the block of memory cells based at least in part on executing the first read command;
- calculating a retention time of stored information associated with the first read command based at least in part on determining the first voltage offset, wherein the retention time indicates a duration associated with a power off state of the block of memory cells; and
- executing one or more additional read commands based at least in part on determining the first voltage offset and calculating the retention time.

19. The method of claim 18, further comprising:
- storing data in the block of memory cells; and
- performing, by the memory system, a power cycling operation after storing the data in the block of memory cells, wherein the first read command is executed based at least in part on performing the power cycling operation.

20. The method of claim 19, wherein the retention time is associated with a duration after the data is stored in the block of memory cells and before the power cycling operation is performed by the memory system.

21. The method of claim 18, further comprising:
- calculating a second voltage offset based at least in part on calculating the retention time, the second voltage offset associated with a second block of memory cells; and
- executing a second read command to retrieve data from the second block of memory cells based at least in part on calculating the second voltage offset.

22. The method of claim 18, further comprising:
- calculating, based at least in part on calculating the retention time and a ratio associated with the first voltage offset, one or more additional voltage offsets associated with the block of memory cells, wherein the one or more additional read commands are executed based at least in part on calculating the one or more additional voltage offsets.

23. The method of claim 18, further comprising:
- calculating, based at least in part on calculating the retention time and a formula associated with the first voltage offset, one or more additional voltage offsets associated with the block of memory cells, wherein the one or more additional read commands are executed based at least in part on calculating the one or more additional voltage offsets.

24. The method of claim 18, further comprising:
- determining whether the first voltage offset associated with the block of memory cells is greater than or equal to a voltage threshold;
- adjusting a persistence parameter associated with execution of read commands based at least in part on determining that the first voltage offset is greater than or equal the voltage threshold;
- executing a second read command to retrieve the page of the block of memory cells based at least in part on adjusting the persistence parameter; and
- determining an updated first voltage offset associated with the block of memory cells based at least in part on executing the second read command, wherein the retention time is calculated and the one or more additional read commands are executed based at least in part on determining the updated first voltage offset.

25. The method of claim 24, wherein the updated first voltage offset is less than the voltage threshold.

* * * * *